United States Patent [19]
Blinne et al.

[11] Patent Number: 6,141,631
[45] Date of Patent: Oct. 31, 2000

[54] PULSE REJECTION CIRCUIT MODEL PROGRAM AND TECHNIQUE IN VHDL

[75] Inventors: Richard D. Blinne; Sudhir K. Patel, both of Fort Collins, Colo.

[73] Assignee: LSI Logic Corporation, Milpitas, Calif.

[21] Appl. No.: 09/047,877

[22] Filed: Mar. 25, 1998

[51] Int. Cl.[7] ............................................. G06F 17/50
[52] U.S. Cl. ....................................... 703/14; 703/13
[58] Field of Search .................... 395/500.07, 500.19, 395/500.34, 500.43; 702/60

[56] References Cited

U.S. PATENT DOCUMENTS

| | | | |
|---|---|---|---|
| 4,656,580 | 4/1987 | Hitchcock et al. | 364/200 |
| 4,787,062 | 11/1988 | Nei et al. | 364/900 |
| 5,091,872 | 2/1992 | Agrawal | 364/578 |
| 5,418,735 | 5/1995 | Saitoh | 364/578 |
| 5,657,239 | 8/1997 | Grodstein et al. | 364/488 |
| 5,875,111 | 2/1999 | Patel | 364/488 |

*Primary Examiner*—Kevin J. Teska
*Assistant Examiner*—Lonnie A. Knox

[57] ABSTRACT

A method determines the behavior of a logic cell that receives input signals resulting in a narrow pulse or "glitch." If the pulse width of the output pulse is narrower than a pulse rejection period, the output pulse is rejected and is not propagated to subsequent logic cells connected to the output. The method employs a first internal logic cell model which is assigned an inertial delay function, and a second internal logic cell model which is assigned a transport delay function. In combination, the first and second logic cell models result in an effective propagation delay value, subject to the pulse rejection feature. An exemplary VHDL model is disclosed. A program product embodies a logic cell model in VHDL providing pulse rejection capabilities for output pulses with pulse width smaller than a pulse rejection period.

14 Claims, 4 Drawing Sheets

PULSE REJECTION CIRCUIT MODEL PROGRAM AND TECHNIQUE IN VHDL

BACKGROUND OF THE INVENTION

1. Field of the Invention

The present invention pertains generally to electrical computers and more particularly to devices and methods of modeling and simulating an electrical circuit.

2. Background of the Invention

Modern electronic chip designers commonly employ functional models in the design and simulation of electronic circuits. A previous method required circuit designers to connect logic symbols representing logic cells to specify a circuit design. Each logic symbol was associated with data defining the functionality of the corresponding logic cell. This method required the designer to be familiar with the functionality associated with the logic cell represented by each logic symbol. After a circuit was specified using the logic symbols, a designer could translate the representation to a gate-level design database or netlist, which would be the basis for simulation.

Using more modern techniques, a designer may specify the functionality of a circuit in a manner similar to specifying the functionality of a software module. Such functional descriptions are typically textual and are specified in a hardware description language (HDL), such as VHDL (VHSIC Hardware Description Language), Verilog Hardware Description Language and the like. Each language has its own syntax, control flow constructs, and other functionality. VHDL is specified by the IEEE Std. 1164–1993, incorporated herein by reference.

Generally, each language provides the ability to "program" the functionality of a design with little or no specific regard to the underlying functionality and structure of the discrete component logic cells. A designer describes the desired functionality of the electronic circuit using the HDL rather than connecting logic symbols as done in older design methodologies. The functional description is in the form of a register-transfer-level (RTL) description, which is readable by a circuit simulator. The hardware simulator allows the designer perform a RTL simulation and verify the functionality of the hardware design in a manner substantially independent of the underlying hardware logic cells.

After the functional design has been simulated and verified, a gate-level design database or netlist may be generated from the VHDL or Verilog program. Technology dependent gate-level models are combined with the technology independent RTL description to generate the gate-level design database or netlist. This process is known as "logic synthesis." The gate-level design database or netlist may then be simulated to verify design functionality using a particular logic cell library in a particular semiconductor technology. The design database or netlist is also used as input to subsequent stages of the design process, such as routing metal interconnections between logic cells using a place-and-route tool and generating mask works required in the semiconductor fabrication process using pattern generation.

A key element of this modern design and simulation process is the initial development of the functional models used to define various logic cells. In gate-level-simulations, the various logic cell models are combined to achieve the HDL-specified functionality of the desired circuit design in a specific cell library and semiconductor technology. For example, a designer may require a Boolean AND function in a desired circuit design. The designer programs AND functionality in a VHDL description of the circuit functionality, and the logic synthesis tool may select an AND logic cell model to achieve this functionality in the gate-level design description. For the purposes of this example, assume the AND function accepts two input operands, performs the Boolean AND operation on the two operands, and provides a single output result of the operation. Accordingly, the logic cell model must be defined to accept two parameters and to generate a single output. In addition, the logic cell model is also associated with functionality information, including the Boolean operation itself, the signal propagation delay from each input to the single output, and other functional characteristics.

The propagation delay characteristics of logic paths within the Boolean AND function are crucial functional features. Specifically, the propagation delay characterizes the time between a signal transition at an input to the logic cell and the resulting signal transition, if any, at the output of the logic cell. Propagation delay information is used to schedule signal transitions during design simulations to ascertain the timing relationships between signals during operation of the circuit.

A circuit in simulation may experience timing mismatches that create unintentional or spurious signal transitions within the circuit. For example, a signal transition may occur at one input of the previously described AND logic cell, quickly followed by a signal transition at the other input of the AND logic cell. In this situation, if each input transition results in a corresponding output signal transition, the output signal will be a narrow pulse. If the pulse width of the output pulse is narrower than a predetermined width, it may be desirable to suppress the narrow output pulse (also called a "glitch") to prevent its propagation to the subsequent input. The technique is called "pulse rejection", and the predetermined width is called a "pulse-rejection period".

Some simulators provide pulse handling functionality in the simulator itself. For example, U.S. Pat. No. 5,091,872, issued to Agrawal, discloses a logic simulator for detecting a spike condition at the output of a simulated gate and producing an "unknown" or undefined output event in response. Likewise, U.S. Pat. No. 4,787,062, issued to Nei et. al., discloses a glitch detection algorithm implemented in a hardware accelerator or simulator.

In contrast, the Verilog Hardware Description Language allows the designer to set an arbitrary pulse rejection parameter within the Verilog description of a logic cell, causing the logic cell to suppress pulses having pulse widths below the specified width during simulation. This capability is an inherent function of the Verilog Hardware Description Language itself and does not require a particular logic cell modeling technique. VHDL, however, does not support arbitrary pulse rejection within the language itself. Instead, VHDL only supports pulse rejection for pulses having pulse widths equaling the propagation delay of the logic cell or, of course, equaling zero. Furthermore, a VHDL-specified design may be simulated within a simulator that does not support arbitrary pulse rejection. Therefore, a need exists to provide an efficient method and device to provide arbitrary pulse rejection functionality in a hardware design specified in VHDL and simulated in a simulator that does not support arbitrary pulse rejection itself.

SUMMARY OF THE INVENTION

It is therefore an object of the present invention to provide a device that provides pulse rejection capabilities to a logic cell modeled in VHDL.

It is another object of the present invention to provide a device that rejects pulses in a VHDL-based logic cell model during simulation in a simulator that does not provide pulse rejection capabilities inherently.

It is another object of the present invention to provide a technique for rejecting pulses in a VHDL logic cell model when simulated in a simulator that lacks pulse rejection capabilities.

Additional objects, advantages, and novel features of the invention will be set forth in part in the description which follows and in part will become apparent to those skilled in the art upon examination of the following or may be learned by practice of the invention. The objects and advantages of the invention may be realized and attained by means of the instrumentalities and combination particularly pointed out in the appended claims.

To achieve the foregoing and other objects, and in accordance with the purposes of the present invention, as embodied and broadly described herein, the computer-readable program product in accordance with the invention may comprise instructions for providing a logic cell model that represents an electrical logic circuit having a first internal logic cell model and a second internal logic cell model; providing a specified pulse rejection period associated with a logic cell; coupling the first internal logic cell model to the input port; coupling the first internal logic cell model to generate a simulated internal pulse; coupling the second internal logic cell model to the output port; assigning an inertial delay function to the first internal logic cell model; setting the result of the inertial delay function to equal zero if the pulse width of the simulated internal pulse is smaller than the pulse rejection period; setting the result of the inertial delay function to equal the pulse rejection period if the pulse width of the simulated internal pulse exceeds the pulse rejection period; and assigning a transport delay function to the second internal logic cell model.

The present invention may also comprise, in accordance with its object and purposes, a method having the steps of providing a logic cell model that represents an electrical logic circuit having a first internal logic cell model and a second internal logic cell model; coupling the first internal logic cell model to the input port; providing a specified pulse rejection period associated with a logic cell, coupling the first internal logic cell model to generate a simulated internal pulse; coupling the second internal logic cell model to the output port; assigning an inertial delay function to the first internal logic cell model; setting the result of the inertial delay function to equal zero if the pulse width of the simulated internal pulse is smaller than the pulse rejection period; setting the result of the inertial delay function to equal the pulse rejection period if the pulse width of the simulated internal pulse exceeds the pulse rejection period; and assigning a transport delay function to the second internal logic cell model.

DETAILED DESCRIPTION OF THE INVENTION

For the purposes of this disclosure, the "intrinsic propagation delay" of a logic cell describes the time between a signal transition at the input of a logic cell and a corresponding signal transition at the output of the logic cell. In contrast, the "effective propagation delay" of a logic cell model describes the delay between such transitions when a pulse rejection feature is applied to the logic cell model. If the output signal is a pulse with a pulse width smaller than a pulse rejection period, provided by the model designer or technology library, then the pulse rejection feature prevents the propagation of the pulse transitions through to the output of the logic cell model and, therefore, the effective propagation delay equals zero.

Figure 1:
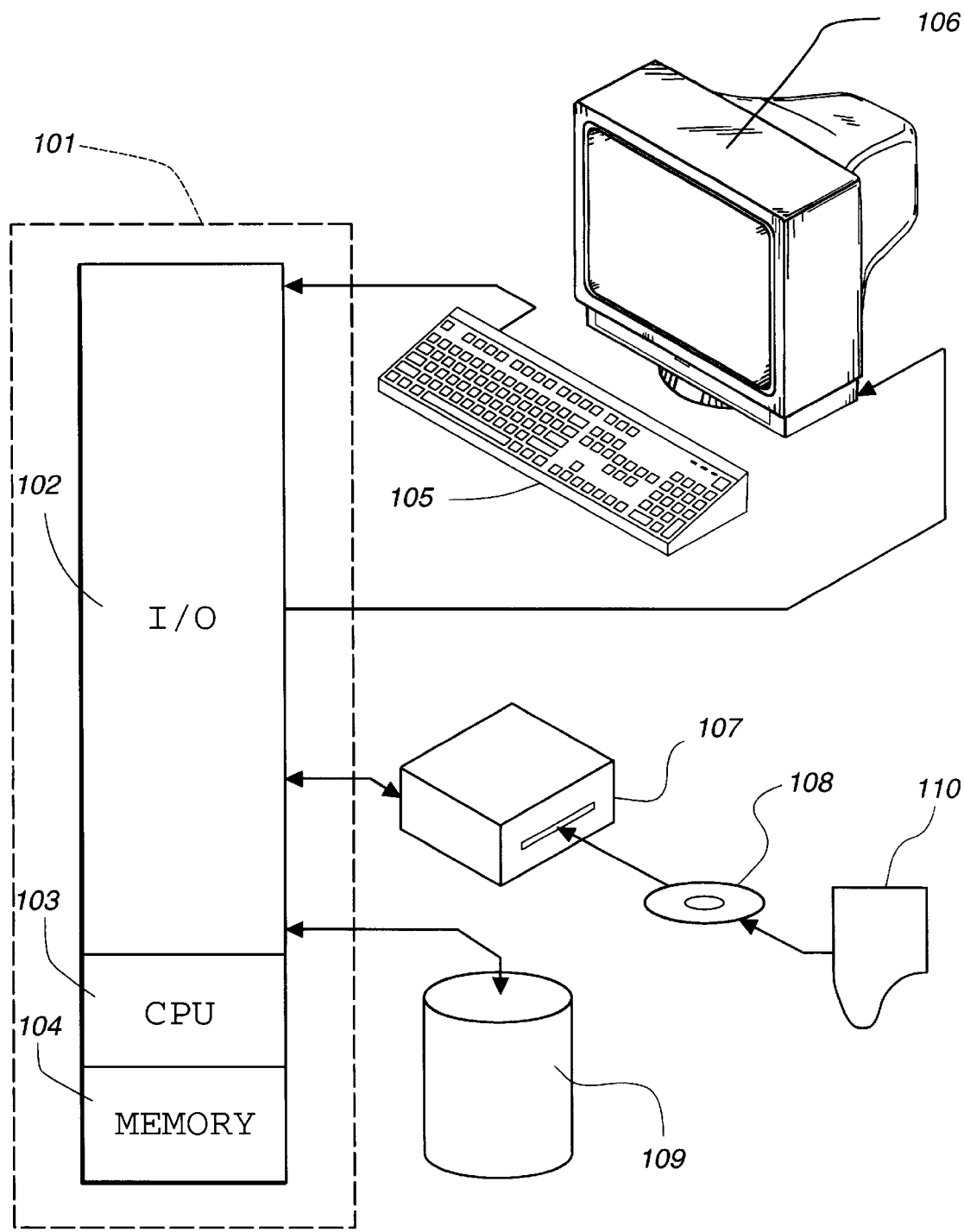
FIG. 1 depicts a general purpose computer system capable of executing a VHDL simulator.

One operating environment in which the present invention is potentially useful encompasses the general purpose computer. In such a system, data and program files may be input to the computer, which reads the files and executes the programs therein. Some of the elements of a general purpose computer are shown in FIG. 1, wherein a processor 101 is shown having an input/output (I/O) section 102, a Central Processing Unit (CPU) 103, and a memory section 104.

The I/O section 102 is connected to keyboard 105, display unit 106, disk storage unit 109, and disk drive unit 107. Generally, in contemporary systems, the disk drive unit 107 is a CD-ROM driver unit capable of reading a CD-ROM medium 108, which typically contains programs 110 and data. Computer program products or circuit models containing mechanisms to effectuate the apparatus and methods in accordance with the present invention may reside in the memory section 104, on a disk storage unit 109, or on the CD-ROM medium 108 of such a system. Alternatively, disk drive unit 107 may be replaced by a floppy drive unit, a tape drive unit, or other storage medium drive unit. Examples of such systems include SPARC systems offered by Sun Microsystems, Inc., personal computers offered by IBM Corporation and by other manufacturers of IBM-compatible personal computers, and other systems running the UNIX-based operating system. In accordance with the present invention, simulator software may be executed by CPU 103, and the functional description of the circuit design and the accompanying logic cell model library may be stored on disk storage unit 109, disk drive unit 107 or other storage medium drive unit coupled to the system.

Figure 2:
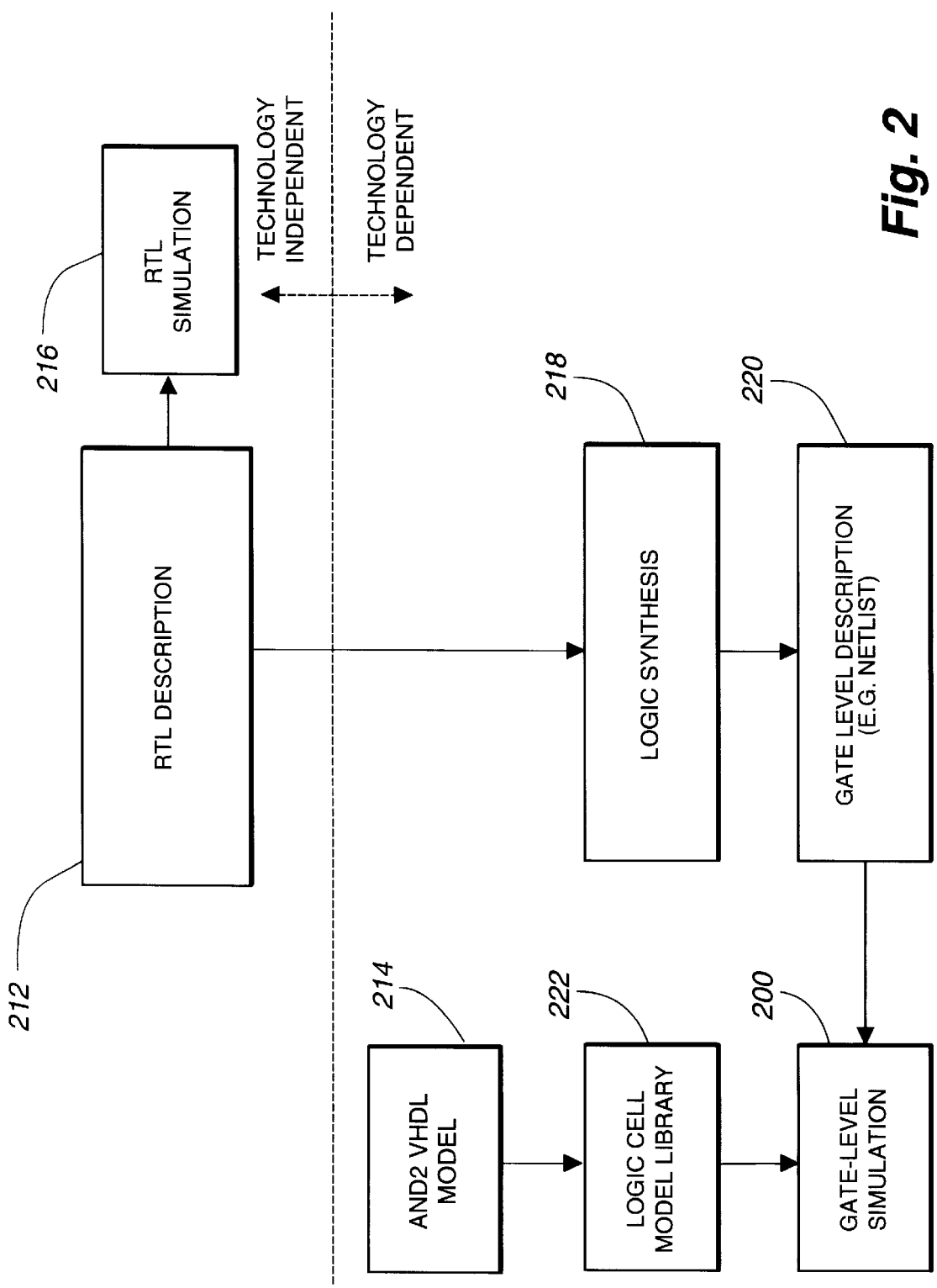
FIG. 2 depicts a process for logic synthesis of a VHDL-based circuit description.

FIG. 2 shows a generalized design methodology 200 employing logic synthesis in accordance with the present invention. It should be understood that the descriptions contained herein are in terms of a suite of software "blocks" or data modules that can be run on and input into any suitable computer system (shown, for example, in FIG. 1). Moreover, descriptions contained herein are also in terms of steps taken by a designer within the design environment.

A designer typically begins designing a circuit by formulating a functional description of a circuit's desired operation in a "high-level computer language," such as VHDL or Verilog. In FIG. 2, a functional description is represented in block 212 showing an RTL description. The resulting RTL description is simulated in block 216 to ensure that it operates according to functional requirements. The RTL description is then synthesized in block 218 by mapping the functional description into a specific gate-level description, shown in block 220. Logic cell models in accordance with the present invention, such as AND2 logic cell model 214, are included in logic cell model library 222 and are input in combination with the gate-level description into block 200 for gate-level simulation.

Figure 3A:
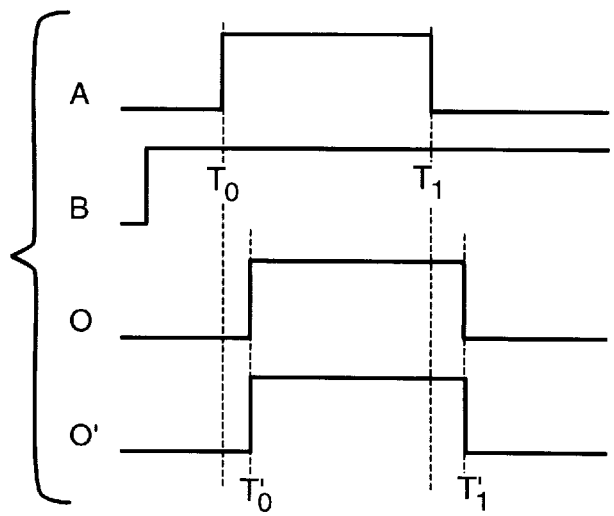
FIG. 3A depicts a logic cell model passing an output pulse to the input of a subsequent logic cell.
Figure 3B:
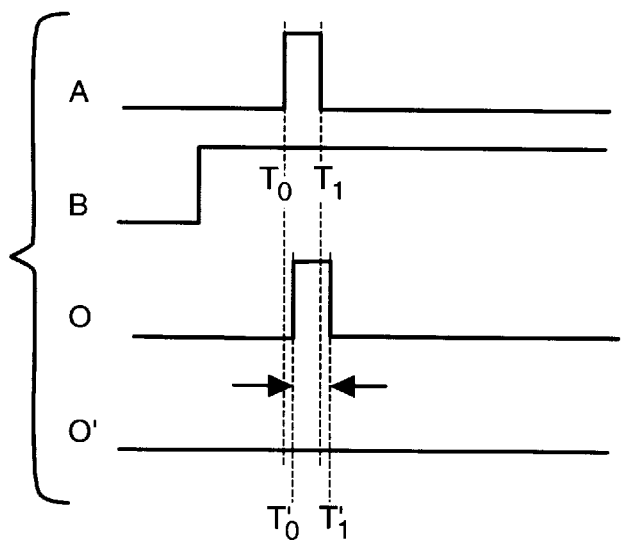
FIG. 3B depicts a logic cell model receiving a narrow input pulse and rejecting the resulting output pulse having a pulse width smaller than the pulse rejection period.
Figure 3C:
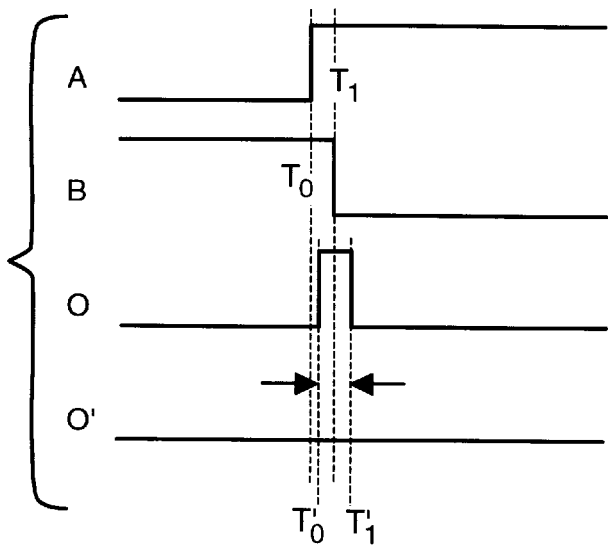
FIG. 3C depicts a logic cell model receiving narrowly spaced input signal transitions on separate input ports and rejecting the resulting output pulse having a pulse width smaller than the pulse rejection period.

FIGS. 3A, 3B, and 3C illustrate three scenarios that may occur when a logic cell model could produce a pulse at its output and the corresponding behavior of a preferred embodiment in accordance with the present invention. Each figure illustrates signals of an AND gate having inputs A and B and output O. Signals A and B represent signals to the corresponding inputs, and signal O represents the output signal without pulse rejection. O' represents the output signal after pulse rejection is applied. In each figure, time $T_0'$ equals $T_0$ plus the intrinsic propagation delay of the logic cell from an input to output O, and time $T_1'$ equals $T_1$ plus the intrinsic propagation delay of the logic cell from an input to output O.

In FIG. 3A, input signal B starts low and transitions high at a time well before time $T_0$. Input signal A starts low and transitions high at time $T_0$. Consequently, by operation of the AND operation, output signal O starts low and transitions high at time $T_0'$. In addition, input signal A remains high for a period of time ($T_1$ minus $T_0$) before it transitions low at time $T_1$. Consequently, the signal at output O also transitions low at time $T_1'$. In FIG. 3A, ($T_1'$ minus $T_0'$) exceeds the pulse rejection period, therefore the output pulse is not suppressed, as shown by signal O'.

FIG. 3B also illustrates signals of an AND gate having inputs A and B and output O. Input signal B starts low and transitions high at a time well before $T_0$, and input signal A starts low and transitions high at time $T_0$. Consequently, by operation of the AND operation, output signal O starts low and transitions high at time $T_0'$. In addition, input signal A remains high for a period of time ($T_1$ minus $T_0$) before it transitions low at time $T_1$. Consequently, the signal at output O transitions low at time $T_1'$. In FIG. 3B, ($T_1'$ minus $T_0'$) is less than the pulse rejection period, therefore the output pulse is suppressed, as shown by signal O'.

FIG. 3C also illustrates signals of an AND gate having inputs A and B and output O. Input signal B starts high. Input signal A starts low and transitions high at time $T_0$. Consequently, by operation of the AND operation, output signal O starts low and transitions high at time $T_0'$. Input signal B then transitions low at time $T_1$. Consequently, the signal at output O transitions low at time $T_1'$. In FIG. 3C, ($T_1'$ minus $T_0'$) is less than the pulse rejection period, therefore the output pulse is suppressed, as shown by signal O'.

Figure 4:
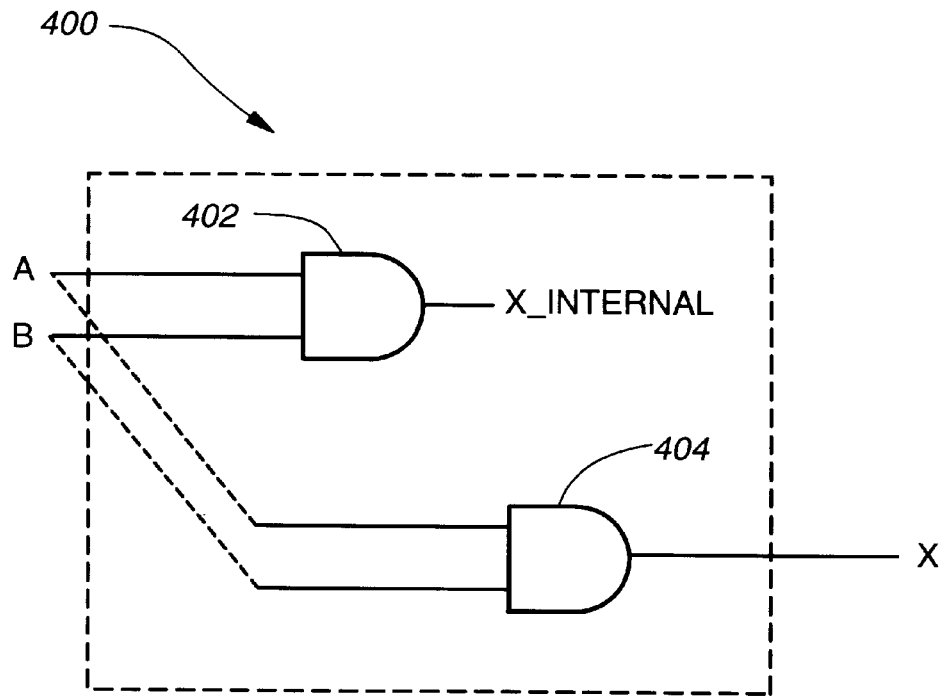
FIG. 4 depicts a "parallel mode" embodiment in accordance with the present invention.

As discussed, VHDL does not support such arbitrary pulse rejection within the language itself. Nevertheless, when a VHDL description is simulated in a simulator that does not support pulse rejection, a designer may wish to include pulse rejection capabilities in a simulation. Accordingly, FIG. 4 illustrates a preferred embodiment of a VHDL-based logic cell model for an AND gate that provides pulse rejection capabilities. Block 400 generally shows a logic cell model with inputs A and B and output X. The logic cell represented by logic cell model 400 has an intrinsic propagation delay associated with it. Internal to block 400, there exist two component logic cell models 402 and 404. Logic cell model 402 is coupled to external input A and B and to internal output X_INTERNAL. Logic cell model 404 is also coupled to external inputs A and B as well as external output X.

In defining logic cell model 402, the designer assigns inertial delays between each input and the internal output X_INTERNAL. An inertial delay is a delay model used for switching circuits. An output pulse whose duration is shorter than the propagation delay assigned to the logic cell will not be transmitted to the output of the logic cell (i.e., the output pulse will be rejected). In FIG. 4, the propagation delay assigned to logic cell 402 is equal to the pulse rejection period for logic cell 400. Accordingly, if an output pulse width from logic cell 402 is less than the pulse rejection period, the output pulse will be rejected and no transition will appear at internal output X_INTERNAL.

The behavior of logic cell model 404 is dependent on a transition at internal output X_INTERNAL. If the result of the inertial delay function is non-zero, a signal transition occurs at X_INTERNAL, and the simulator will initiate the VHDL process defining logic cell 404 to determine the behavior of the signal path between external inputs A and B and external output X. If no transition occurs at internal output X_INTERNAL, a transport delay function characterizing logic cell model 404 is not initiated, and no signal transition is reflected at external output X.

Transport delays are assigned to logic cell model 404. A transport delay is an optional delay for signal assignment within VHDL. Transport delay is characteristic of hardware devices (such as transmission lines) that exhibit infinite frequency response: any pulse is transmitted, no matter how short its duration. The characteristics of both inertial delays and transport delays in VHDL are well known in the art, and are described in Ben Cohen, *VHDL Coding Styles and Methodologies*, 1995, incorporated herein by reference. Accordingly, when a signal transition occurs at X_INTERNAL, the simulator calculates the transport delay of logic cell model 404 to determine the behavior at external output X.

To achieve pulse rejection in logic cell model 400, logic cell model 402 is assigned with an artificial propagation delay equaling the pulse rejection period. Consequently, if the output pulse at X_INTERNAL would be narrower than the pulse rejection period, the inertial delay model will suppress the output pulse so that no signal transition occurs at internal output X_INTERNAL. In contrast, the transport delay of logic cell model 404 is assigned a propagation delay equaling the intrinsic propagation delay of the logic cell modeled by logic cell model 400. As a result, if the input signals to logic cell model 402 generate an output pulse with a pulse width narrower than the pulse rejection period, the VHDL process modeling logic cell model 404 does not execute and there is no output transition at external output X. Otherwise, if external inputs A and B to logic cell model 402 produce an output pulse at internal output X_INTERNAL having a pulse width greater than the pulse rejection period, the output pulse is not rejected and the VHDL process modeling logic cell model 404 is executed, thereby calculating the effective propagation delay of the AND gate modeled by logic cell model 400.

Figure 5:
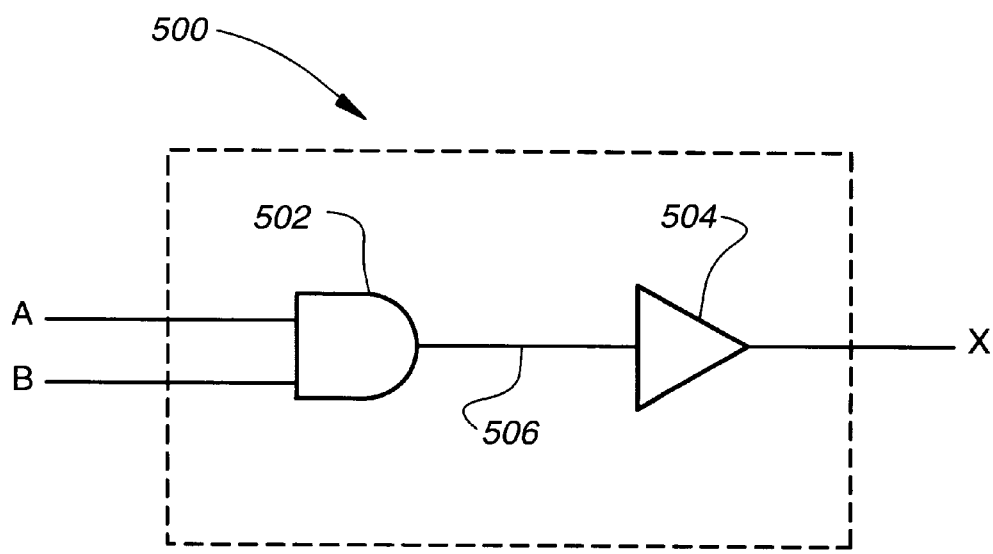
FIG. 5 depicts a "serial mode" embodiment in accordance with the present invention.

FIG. 5 illustrates an alternative embodiment in accordance with the present invention. Block 500 represents a logic cell model of an AND logic cell having external inputs A and B and external output X. Logic cell model 500 includes logic cell model 502 having two inputs coupled to external inputs A and B and a single internal output 506, which is coupled to logic cell model 504. Logic cell model 504 has one input and one output, the output being coupled to external output X. Logic cell model 502 is assigned an inertial delay having a propagation delay equal to the pulse rejection period for logic cell model 500. In addition, logic cell model 504 is assigned a transport delay having a propagation delay equal to the intrinsic propagation delay of the logic cell represented by logic cell model 500 minus the pulse rejection period. When the input signals at logic cell model 502 generate an output pulse at output 506 having a pulse width greater than the pulse rejection period, the pulse propagates to the input of logic cell model 504 and the VHDL process modeling logic cell model 504 is executed. The propagation delay calculated for logic cell model 504 is equal to the intrinsic propagation delay of the logic cell represented by logic cell model 500 minus the pulse rejection period. Consequently, the effective propagation delay of logic cell model 500 from input to output X equals the pulse rejection period assigned to logic cell model 502 plus (the propagation delay of logic cell model 504 minus the pulse rejection period). Accordingly, the effective propagation delay of logic cell 500, from external input A or B to external output X, equals the intrinsic propagation delay of logic cell model 500, when the input signals to logic cell model 502 generate a pulse width at internal output 506 greater than the pulse rejection period.

If, however, the input signals to logic cell model 502 generate an output pulse at internal output 506 having a pulse width narrower than the pulse rejection period, the inertial delay function in logic cell model 502 suppresses the output pulse and no input transition is received by the input of logic cell model 504. Accordingly, the effective propagation delay of logic cell 500, from external input A or B to external output X, equals zero.

Although this description uses an AND gate to exemplify the present invention, the technique is applicable to any logic cell having an input-to-output path, including OR gates, NAND gates, buffers, inverters, and so on. In addition, the polarity of the signal transitions does not alter the effectiveness of this technique because the inertial delay, the transport delay, and the propagation delay functions are configured for both low-high and high-low transitions.

Gate-level modeling of logic cells in VHDL has been standardized by the industry and adopted by IEEE. A model generated in accordance with the present invention may be IEEE 1076.4 VITAL ASIC Modeling Standard—Level 1 Compliant. The VITAL standard specifies standard procedures and mechanisms for back annotation of Standard Delay Format (SDF) files, which contain estimated or characterized delays of logical paths within the design. The standard mechanisms are in the form of helper routines that facilitate common tasks, such as reading and writing SDF format. Compliance with the VITAL ASIC Modeling Standard provides high performance and extensive portability to any industry standard VITAL-compliant simulator. The VITAL ASIC Modeling Standard is well known in the art, and IEEE Standard 1076.4 is incorporated herein by reference The following VITAL-compliant VHDL source code describes an example embodiment in accordance with the present invention. Specifically, the source code below defines an AND cell with 2 input ports (labeled below as "AND2") configured in the "parallel mode" model illustrated in FIG. 4 and described herein.

```
library vs350;
use vs350.misc.all;
library IEEE;
use IEEE.STD_LOGIC_1164.all;
```

-continued

```
library IEEE;
use IEEE.VITAL_Timing.all;
- entity declaration -
entity AND2 is
    generic(
        CorePulseRejection : VitalDelayType01 := (50 ps, 50 ps);
        TimingChecksOn: Boolean := True;
        InstancePath: STRING := "*";
        Xon: Boolean := True;
        MsgOn: Boolean := True;
        tpd_A_X                : VitalDelayType01 := tpd_default;
        tpd_B_X                : VitalDelayType01 := tpd_default;
        tipd_A                 : VitalDelayType01 := tipd_default;
        tipd_B                 : VitalDelayType01 := tipd_default);
    port (
        A                      : in STD_LOGIC;
        B                      : in STD_LOGIC;
        X                      : out STD_LOGIC;
    attribute VITAL_LEVEL0 of AND2 : entity is TRUE;
end AND2;
- architecture body -
library IEEE;
use IEEE.VITAL_Primitives.all;
architecture VITAL of AND2 is
    attribute VITAL_LEVEL1 of VITAL : architecture is TRUE;
    SIGNAL X_internal : STD_LOGIC := 'X';
    SIGNAL A_ipd : STD_LOGIC := 'X';
    SIGNAL B_ipd : STD_LOGIC := 'X';
begin
    -----------------
    - INPUTPATHDELAYS
    -----------------
    WireDelay : block
    begin
    VitalWireDelay (A_ipd, A, tipd_A);
    VitalWireDelay (B_ipd, B, tipd_B);
    end block;
    -----------------
    - BEHAVIOR SECTION
    -----------------
    VITALInert : process (A_ipd, B_ipd)
    - functionality results
    VARIABLE Results : STD_LOGIC_VECTOR(1 to 1) :=
    (others => 'X');
    ALIAS X_zd : STD_LOGIC is Results(1);
    - output glitch detection variables
    VARIABLE X_GlitchData            : VitalGlitchDataType;
begin
    ---------------
    - Functionality Section
    ---------------
    X_zd := (B_ipd) AND (A_ipd);
    ---------------
    - Path Delay Section
    ---------------
    VitalPathDelay01 (
        OutSignal => X_internal,
        GlitchData => X_GlitchData,
        OutSignal Name => "X",
        OutTemp => X_zd,
        Paths =>    (0 => (A_ipd'last_event, CorePulseRejection,
                        TRUE),
                     1 => (B_ipd'last_event, CorePulseRejection,
                        TRUE)),
        Mode => VitalInertial,
        Xon => Xon,
        MsgOn => MsgOn,
        MsgSeverity => WARNING);
end process;
    Vital_X : process (X_internal)
    - functionality results
    VARIABLE Results : STD_LOGIC_VECTOR (1 to 1) :=
    (others => 'X');
    ALIAS X_zd : STD_LOGIC is Results(1);
    - output glitch detection variables
    VARIABLE X_GlitchData            : VitalGlitchDataType;
    begin
    ---------------
    - Functionality Section
```

-continued

```
X_zd := (B_ipd) AND (A_ipd);
- Path Delay Section
VitalPathDelay01 (
    OutSignal => X,
    GlitchData => X_GlitchData,
    OutSignalName => "X",
    OutTemp = X_zd.
    Paths =>    (0 => (A_ipd'last_event, tpd_A_X,
                TRUE),
                1 => (B_ipd'last_event, tpd_B_X,
                TRUE)),
    Mode => VitalTransport,
    Xon => Xon,
    MsgOn => MsgOn,
    MsgSeverity => WARNING);
end process;
end VITAL;
configuration CFG_AND2_VITAL of AND2 is
    for VITAL
    end for;
end CFG_AND2_VITAL;
```

While the method disclosed herein has been described and shown with reference to particular steps performed in a particular order (e.g., in the VITAL-compliant VHDL source code), it will be understood that these steps may be combined, sub-divided, or re-ordered to form an equivalent method without departing from the teachings of the present invention. Accordingly, unless specifically indicated herein, the order and grouping of the steps is not a limitation of the present invention.

Moreover, while there have been described herein the principles of the present invention in conjunction with a specific VHDL code segment, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for simulating behavior of a logic cell including inertial delay behavior in a VITAL compliant system, said logic cell having an input port, an output port, and an intrinsic propagation delay, said input port being coupled to receive an input signal, said output port being coupled to generate an output signal, said method comprising the steps of:

modeling said logic cell using a first internal VITAL logic cell model to represent said inertial delay behavior and a second internal VITAL logic cell model to represent transport delay behavior;

specifying a first propagation delay associated with said first internal VITAL logic cell model and a transport delay associated with said second internal VITAL logic cell model;

coupling said first and second internal logic cell models wherein said first internal VITAL logic cell model dictates said inertial delay behavior and wherein said second internal VITAL logic cell model accounts for said intrinsic propagation delay of said logic cell; and simulating said logic cell.

2. The method of claim 1 wherein the step of coupling comprises the steps of:

coupling an input port of said second internal VITAL logic cell model and said first internal VITAL logic cell model, in a parallel configuration, to said input port, said first internal logic cell model having an internal output port;

coupling an output port of said first internal logic cell model to said output port; and initiating a simulation of said second internal logic cell model upon a transition at said internal output port.

3. The method of claim 2 and further comprising the step of assigning said transport delay to a value equal to the intrinsic propagation delay of the logic cell.

4. The method of claim 2 and further comprising the step of assigning said first propagation delay to a value equal to an inertial delay of the logic cell.

5. The method of claim 1 wherein the step of coupling further comprises the steps of:

coupling an input port of said second internal VITAL logic cell model to said input port;

coupling an output port of said second internal VITAL logic cell model to an input port of said first internal logic cell model; and coupling an output port of said first internal VITAL logic cell model to said output port of said logic cell.

6. The method of claim 5 and further comprising the steps of;

assigning said transport delay to a value equal to the intrinsic propagation delay of said logic cell less a value equal to an inertial delay of said logic cell.

7. The method of claim 5 and further comprising the step of assigning said first propagation delay to a value equal to an inertial delay of said logic cell.

8. A program storage medium, readable by a computer, tangibly embodying a program of instructions executable by said computer for defining behavior of a logic cell including inertial delay behavior in a VITAL compliant system, said logic cell having an input port, an output port, and an intrinsic propagation delay, said input port being coupled to receive an input signal, said output port being coupled to generate an output signal, the program comprising instructions for:

providing a logic cell model that represents an electrical logic circuit having a first internal VITAL logic cell model and a second internal VITAL logic cell model;

providing a specified first propagation delay associated with said first internal VITAL logic cell model and a transport delay associated with said second internal VITAL logic cell model; and coupling said first and second internal VITAL logic cell models wherein said first internal VITAL logic cell model dictates said inertial delay behavior and wherein said second internal VITAL logic cell model accounts for said intrinsic propagation delay of said logic cell; and simulating said logic cell.

9. The program of claim 8 and further comprising instructions for:

coupling an input port of said second internal VITAL logic cell model and said first internal VITAL logic cell model, in a parallel configuration, to said input port, said first internal VITAL logic cell model having an internal output port;

coupling an output port of said second internal logic cell model to said output port of said logic cell; and initiating a simulation of said second internal logic cell model upon a transition at said internal output port.

10. The program of claim 9 and further comprising instructions for assigning said transport delay to a value equal to said intrinsic propagation delay of said logic cell.

11. The program of claim 9 and further comprising the step of assigning said first propagation delay to a value equal to an inertial delay of said logic cell.

12. The program of claim 8 and further comprising instructions for:

coupling an input port of said second internal VITAL logic cell model to said input port;

coupling an output port of said second internal VITAL logic cell model to an input port of said first internal VITAL logic cell model; and coupling an output port of said first internal VITAL logic cell model to said output port of said logic cell.

13. The method of claim 12 and further comprising instructions for:

assigning said transport delay to a value equal to said intrinsic propagation delay of said logic cell less an inertial delay of said logic cell.

14. The method of claim 12 and further comprising the step of assigning said first propagation delay to a value equal to an inertial delay of said logic cell.

* * * * *